United States Patent
Wind et al.

(10) Patent No.: US 6,653,832 B2
(45) Date of Patent: Nov. 25, 2003

(54) METHOD FOR HIGH RESOLUTION MAGNETIC RESONANCE ANALYSIS USING MAGIC ANGLE TECHNIQUE

(75) Inventors: Robert A. Wind, West Richland, WA (US); Jian Zhi Hu, Richland, WA (US)

(73) Assignee: Battelle Memorial Institute, Richland, WA (US)

(*) Notice: Subject to any disclaimer, the term of this patent is extended or adjusted under 35 U.S.C. 154(b) by 0 days.

(21) Appl. No.: 09/803,381

(22) Filed: Mar. 9, 2001

(65) Prior Publication Data

US 2002/0135365 A1 Sep. 26, 2002

(51) Int. Cl.[7] .................................................. G01L 3/00
(52) U.S. Cl. ........................ 324/307; 324/309; 324/314
(58) Field of Search ................................ 324/300, 306, 324/307, 309, 311, 318, 321, 322, 314, 320

(56) References Cited

U.S. PATENT DOCUMENTS

| | | | |
|---|---|---|---|
| 4,301,410 A | 11/1981 | Wind et al. | 324/307 |
| 4,352,066 A | 9/1982 | Kendrick et al. | 324/321 |
| 4,511,841 A | 4/1985 | Bartuska et al. | 324/321 |
| 4,654,593 A * | 3/1987 | Ackerman | 324/307 |
| 5,208,536 A | 5/1993 | Cory | 324/321 |
| 5,260,657 A | 11/1993 | Lewis et al. | 324/321 |
| 5,872,452 A | 2/1999 | Cory et al. | 324/321 |
| 6,133,733 A | 10/2000 | Lurie et al. | 324/300 |
| 2002/0125887 A1 * | 9/2002 | Wind et al. | 324/307 |
| 2002/0135365 A1 * | 9/2002 | Wind et al. | 324/307 |

OTHER PUBLICATIONS

Alderman et al., *Mol Physics*, 96(6): 1113–1126, 1998.
Antzutkin et al., *J. Magnetic Resonance*, 115:7–19, 1995.
Bax et al., *J. Magnetic Resonance*, 52:147–152, 1983.
Bradbury et al., *Physics Letters*, 26A(9):405–406, 1968.
Cheng et al., *PNAS USA*, 94:6408–6413, 1997.
Gan, *J. Am. Chem. Soc.*, 114:8307–8309, 1992.
Hu et al., *Solid State Nuclear Magnetic Resonance*, 2:235–243, 1993.
Hu et al., *J. Magnetic Resonance*, 105:82–87, 1993.
Hu et al., *J. Magnetic Resonance*, 113:210–222, 1995.
Hu et al., "Magic Angle Turning & Hopping," in *Encyclopedia of Magnetic Resonance*, Grant and Harris, eds., New York, John Wiley & Sons: 2914–2921, 1996.
Lin et al., "Manipulation of Phase and Amplitude Modulation of Spin Magnetization in Magic Angle Spinning NMR in the Presence of Molecular Diffusion," *J. Chem Physics*, in press.
Morris and Freeman, *J. Magnetic Resonance*, 29:433–462, 1978.
Weybright et al., *MRM*, 39:337–344, 1998.
Hesse et al., "22nd Discussion Meeting of the GDCh Division Magnetische Resonanzspektroskopie, Progress in the Magnetic Resonance of Bioactive Compounds and New Materials," Online: www.uni-jena.de/}p6hest/news/00gdch.htm (Sep. 2000).

(List continued on next page.)

*Primary Examiner*—Diego Gutierrez
*Assistant Examiner*—Tiffany A. Fetzner
(74) *Attorney, Agent, or Firm*—Klarquist Sparkman, LLP

(57) ABSTRACT

A method of performing a magnetic resonance analysis of a biological object that includes placing the biological object in a main magnetic field and in a radio frequency field, the main magnetic field having a static field direction; rotating the biological object at a rotational frequency of less than about 100 Hz around an axis positioned at an angle of about 54°44' relative to the main magnetic static field direction; pulsing the radio frequency to provide a sequence that includes a magic angle turning pulse segment; and collecting data generated by the pulsed radio frequency. According to another embodiment, the radio frequency is pulsed to provide a sequence capable of producing a spectrum that is substantially free of spinning sideband peaks.

38 Claims, 9 Drawing Sheets

OTHER PUBLICATIONS

Hughes et al., "*Fluorine–19 Solid–State NMR Magic–Angle–Turning Experiments Using Multiple–Pulse Homonuclear Decoupling*," Journal of Magnetic Resonance, vol. 138, No. 2. pp. 256–267 (Jun. 1999).

Jager et al., "*Diskussionstagung der Fachgruppe Magnetische Resonanz Der Gesellschaft Deutscher Chemiker,*" Online: www.uni–jena.de/}p6hest/news/99gdch.htm/ (Sep. 1999).

Ni et al., "*Low–Speed Magic–Angle–Spinning Carbon–13 NMR of Fruit Tissue,*" Journal of Agricultural and Food Chemistry, Department of Food Science and Whistler Center for Carbohydrate Research, Purdue University, vol. 40, No. 9, pp. 1507–1513 (1992).

Waters et al., "*High–Resolution Magic Angle Spinning $^1H$ NMR Spectroscopy of Intact Liver and Kidney: Optimization of Sample Preparation Procedures and Biochemical Stability of Tissue during Spectral Acquisition,*" Analytical Biochemistry, vol. 282, No. 1, pp. 16–23 (Jun. 2000).

Wind et al., "*An investigation of rat mammary healthy and R3230AC tumor tissues and cells by means of solid–state $^{13}C$ NMR,*" Solid State Nuclear Magnetic Resonance, vol. 7, No. 3, pp. 263–269 (Dec. 1996).

Hu et al., *Magnetic Resonance in Medicine* 47:829–836 (2002).

* cited by examiner

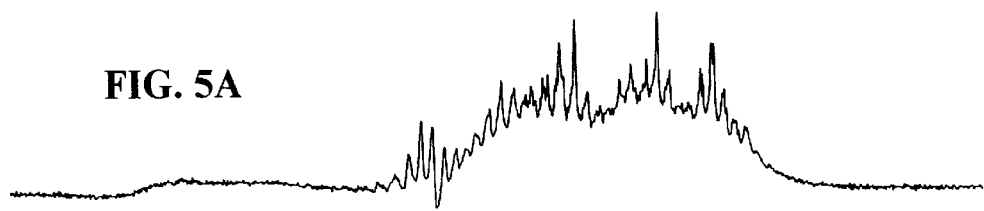
FIG. 5A
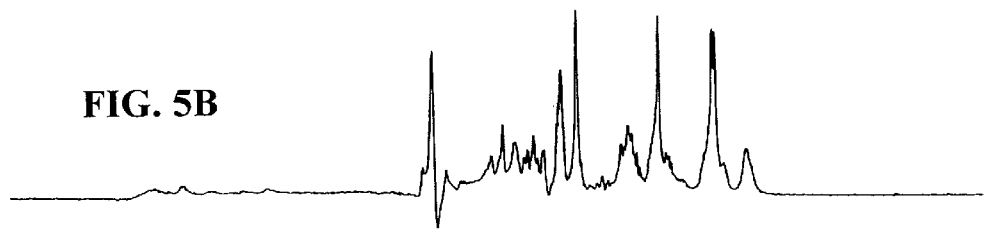
FIG. 5B
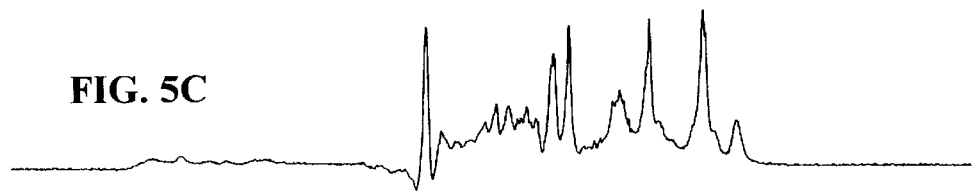
FIG. 5C
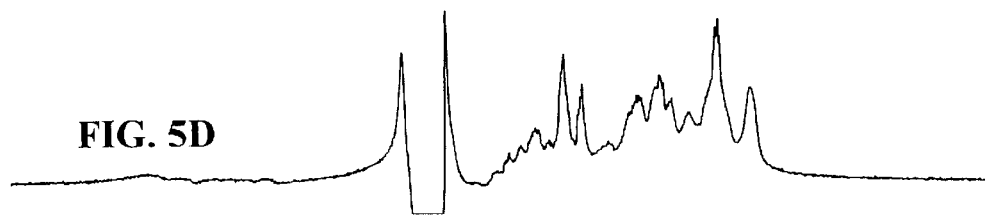
FIG. 5D
FIG. 5E
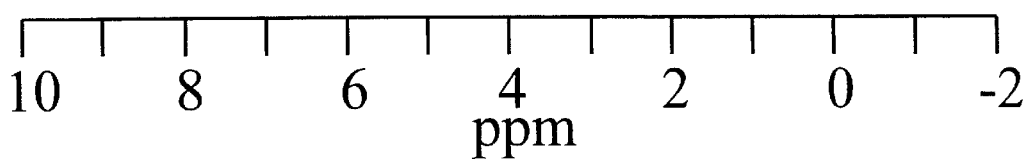

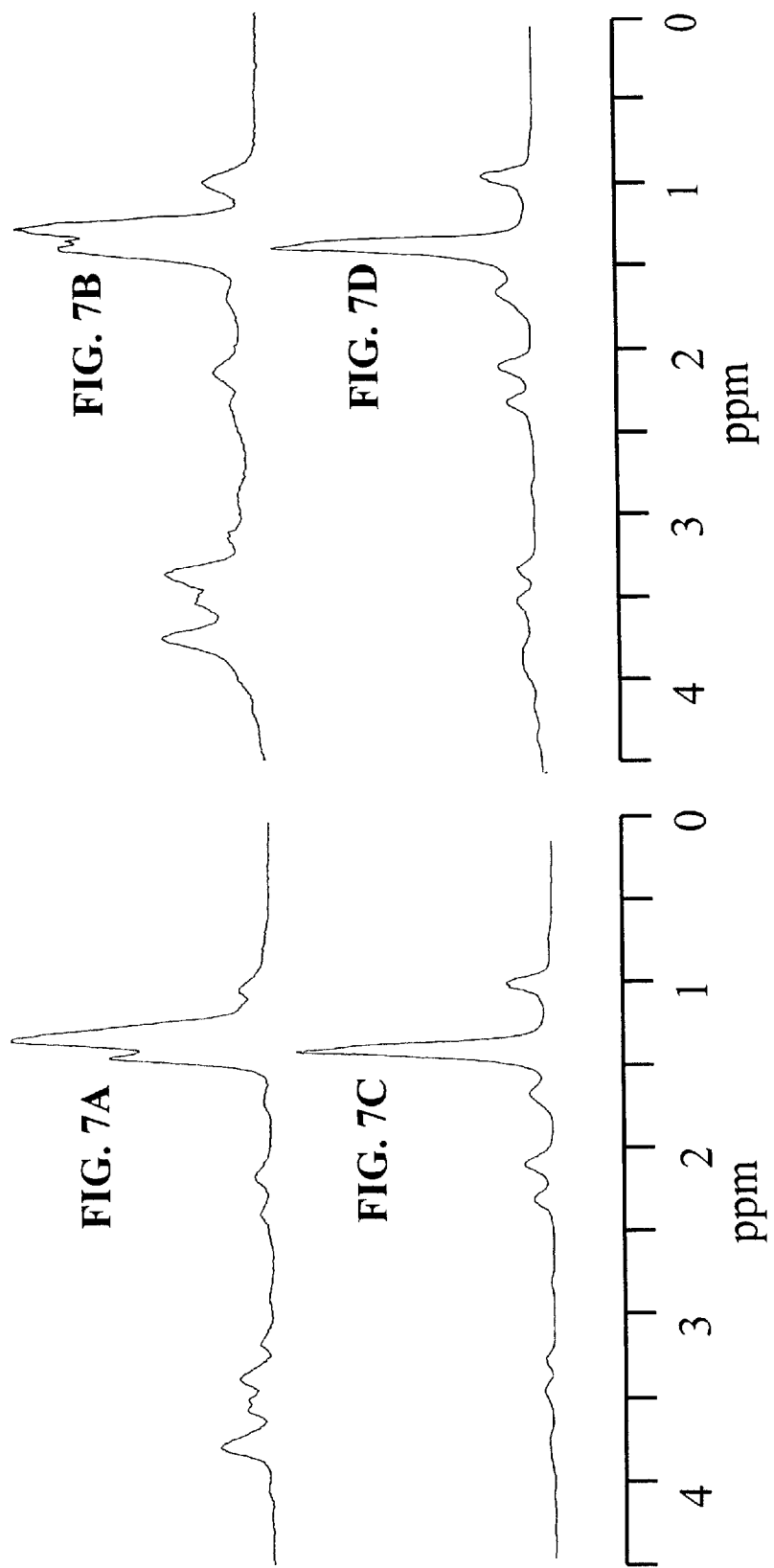

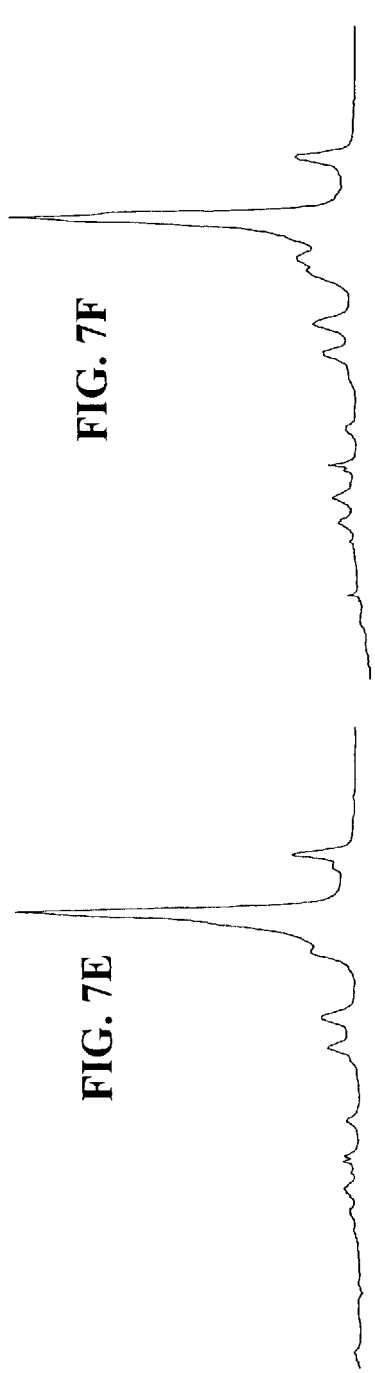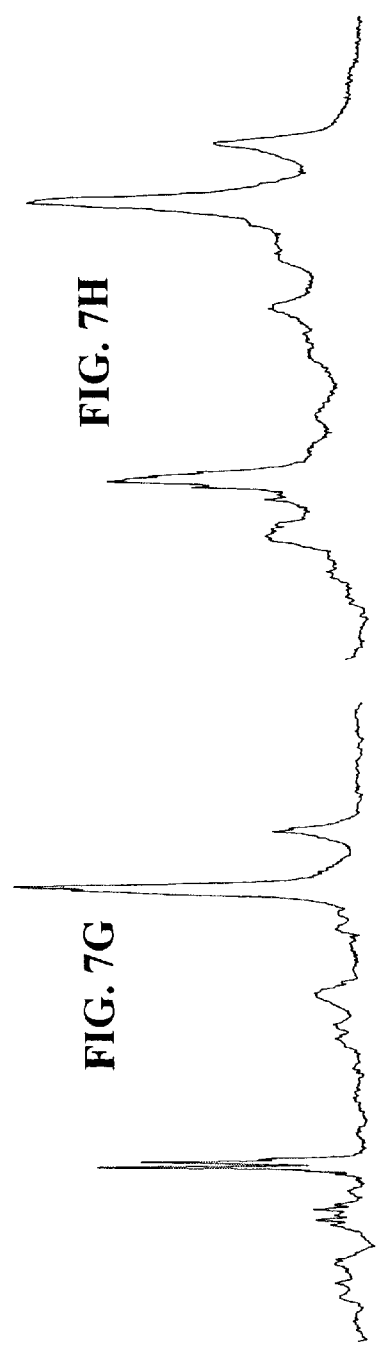

US 6,653,832 B2

METHOD FOR HIGH RESOLUTION MAGNETIC RESONANCE ANALYSIS USING MAGIC ANGLE TECHNIQUE

STATEMENT OF GOVERNMENT SUPPORT

This invention was made with United States Government support under Contract DE-AC0676RLO1830 awarded by the U.S. Department of Energy. The United States Government has certain rights in the invention.

FIELD OF THE INVENTION

The present invention relates to magnetic resonance (MR) analysis, particularly to magnetic resonance spectroscopy (MRS) and imaging (MRI) of biological objects.

BACKGROUND OF THE INVENTION

Magnetic resonance is a phenomenon exhibited by a select group of atomic nuclei and is based upon the existence of nuclear magnetic moments in these nuclei (termed "gyromagnetic" nuclei). When a gyromagnetic nucleus is placed in a strong, uniform and steady magnetic field (a so-called "external field" and referred to herein as a "static" magnetic field), it precesses at a natural resonance frequency known as a Larmor frequency. The Larmor frequency is characteristic of each nuclear type and is dependent on the applied field strength in the location of the nucleus. Typical gyromagnetic nuclei include $^1$H (protons), $^{13}$C, $^{19}$F and $^{31}$P. The resonant frequencies of the nuclei can be observed by monitoring the transverse magnetization that results after a strong RF pulse applied at or near their Larmor frequencies. It is common practice to convert the measured signal to a frequency spectrum by means of Fourier transformation.

More specifically, when a bulk sample containing nuclear magnetic resonance (NMR) active nuclei is placed within a magnetic field, the nuclear spins distribute themselves amongst the nuclear magnetic energy levels in accordance with Boltzmann's statistics. This results in a population imbalance between the energy levels and a net nuclear magnetization. It is this net nuclear magnetization that is studied by NMR techniques.

At equilibrium, the net nuclear magnetization is aligned parallel to the external magnetic field and is static. A second magnetic field perpendicular to the first and rotating at, or near, the Larmor frequency can be applied to induce a coherent motion of the net nuclear magnetization. Since, at conventional field strengths, the Larmor frequency is in the megahertz frequency range, this second field is called a "radio frequency" or RF field.

In particular, a short (microsecond) pulse of RF radiation is applied to the sample in the static magnetic field; this pulse is equivalent to a range of frequencies. The free induction decay (FID) in response to the RF pulse is measured as a function of time. The response of the sample to the pulse depends upon the RF energy absorption of the sample over a range of frequencies applied (for example, 500 MHz±2500 Hz). Often the pulse is applied many times and the results averaged to improve the signal-to-noise ratio.

The coherent motion of the nuclear magnetization about the RF field is called a "nutation." In order to deal conveniently with this nutation, a reference frame is used which rotates about the z-axis at the Larmor frequency. In this "rotating frame" the RF field, which is rotating in the stationary "laboratory" reference frame, is static. Consequently, the effect of the RF field is to rotate the nuclear magnetization direction at an angle with respect to the main static field direction. By convention, an RF field pulse of sufficient length to nutate the nuclear magnetization through an angle of 90° or π/2 radians is called a "π/2 pulse."

A π/2 pulse applied with a frequency near the nuclear resonance frequency will rotate the spin magnetization from an original direction along the main static magnetic field direction into a plane perpendicular to the main magnetic field direction. Because the RF field and the nuclear magnetization are rotating, the component of the net magnetization that is transverse to the main magnetic field precesses about the main magnetic field at the Larmor frequency. This precession can be detected with a receiver coil that is resonant at the precession frequency and located such that the precessing magnetization induces a voltage across the coil. Frequently, the "transmitter coil" employed for applying the RF field to the sample and the "receiver coil" employed for detecting the magnetization are one and the same coil.

In addition to precessing at the Larmor frequency, in the absence of the applied RF field, the nuclear magnetization also undergoes two relaxation processes: (1) the precessions of various individual nuclear spins which generate the net nuclear magnetization become dephased with respect to each other so that the magnetization within the transverse plane loses phase coherence (so-called "spin-spin relaxation") with an associated relaxation time, $T_2$, and (2) the individual nuclear spins return to their equilibrium population of the nuclear magnetic energy levels (so-called "spin-lattice relaxation") with an associated relaxation time, $T_1$. The spin-spin relaxation is caused by the presence of small local magnetic fields, arising from the electrons and magnetic nuclei surrounding a particular nucleus. These fields cause slight variations in the resonance frequency of the nuclei, which results in a broadening of the NMR resonance line. Often this broadening is caused by two types of local fields: a static component, which gives rise to a so-called inhomogeneous broadening, and local fields which are fluctuating in time as a result of molecular motions. The latter phenomenon results in a so-called homogeneous broadening.

Magnetic resonance imaging and magnetic resonance spectroscopy are used extensively in biological research and medicine, both for in vitro investigations of cells and tissues and for in vivo measurements on animals and humans. Both methods are used for a large variety of applications, including the detection and diagnosis of lesions and diseases, and the evaluation of therapy response. One particularly useful MRS technique is $^1$H nuclear magnetic resonance (NMR) spectroscopy. $^1$H NMR spectroscopy has been used extensively to study metabolic changes in diseased cells and tissues and the effects of therapy. The resonance lines corresponding to several key mobile compounds have been observed, and their spectral intensities have been linked to the tumor phenotype, tumorigenesis, tumor size, increased proliferation of cells, cell apoptosis, and necrosis.

However, a serious problem associated with these applications is the relatively large widths of the MR resonance lines that are observed using conventional MRI and MRS. This reduces the MRI and MRS sensitivity, and, for MRS, can result in severely overlapping spectral lines, which seriously hampers the analysis of the spectrum. It has been established that in biological materials the line widths are mainly caused by inhomogeneous broadening. In intact cells and tissues, the possible mechanisms that broaden the lines inhomogeneously include residual chemical shift anisotropy interaction and local magnetic field gradients arising from variations in the bulk magnetic susceptibility at the various compartment boundaries present in the cells and tissues. It is believed in the art that the bulk magnetic susceptibility variations are the main mechanisms responsible for the broadening. Using cell extracts can eliminate this broadening, but this procedure is time consuming and may introduce spectral artifacts.

It is well known that the susceptibility broadening and other inhomogeneous broadening mechanisms can be eliminated by magic angle spinning (MAS), where the sample is rotated about an axis with an angle of 54°44' (or $\cos^{-1}(3^{-1/2})$) with respect to the static magnetic field direction. A problem with MAS is that when the value of the spinning rate is small compared to the width of the broadening, the resonant peak splits into a group of spinning sidebands (SSBs) separated by the spinning rate. If the value of the spinning rate is less than the isotropic spectral width, the analysis of the spectra becomes considerably difficult due to the overlapping of the SSBs associated with the different resonant peaks. This problem can be avoided by increasing the spinning rate to eliminate the SSBs in the spectral region of interest. Indeed it has been shown that fast MAS, where a sample is rotated at a speed of several kHz, produces a significant narrowing of the MR lines in cells and tissues (see Weybright et al., *Gradient, High-Resolution, Magic Angle Spinning $^1$H Nuclear Magnetic Resonance Spectroscopy of Intact Cells*, Magnetic Resonance in Medicine 1998; 39: 337–345; and Cheng et al., *Quantitative Neuropathology by High Resolution Magic Angle Spinning Proton Magnetic Resonance Spectroscopy*, Proc. Natl. Acad. Sci. USA 1997; 94: 6408–6413). However, the large centrifugal force associated with such high spinning rates destroys the tissue structure and even part of the cells (see Weybright et al.). Consequently, MAS at a high spinning speed is not suitable, for example, to map the metabolite distribution in intact biological tissues or to study live cells, and is impossible to use on live subjects.

A possible way to overcome the problems associated with fast MAS is to use slow sample spinning. Many methods have been developed in solid state NMR to eliminate the spinning sidebands or to separate them from the isotropic spectrum so that a sideband free isotropic chemical shift spectrum is obtained. One approach is the so-called magic angle turning (MAT) techniques, and sideband free isotropic chemical shifts have been obtained in solids at spinning rates as low as 30 Hz (Hu et al., *Magic Angle Turning and Hopping*, in Encyclopedia of Magnetic Resonance D. M. Grant, and R. K. Harris, Eds. New York: John Wiley & Sons: 1996, 2914–2921).

MAT is a two dimensional (2D) NMR technique that was developed to determine the chemical shift tensors of rare spins such as $^{13}$C and $^{15}$N in solids. There are basically two types of MAT experiments. The first type (MAT-1) is based on the Magic Angle Hopping (MAH) experiment pioneered by Bax et al., *Correlation of Isotropic Shifts and Chemical Shift Anisotropies by Two-Dimensional Fourier-Transform Magic-Angle Hopping NMR Spectroscopy*, J. Magn. Reson. 1983; 52: 147. The second class (MAT-2) involves the use of five radio frequency $\pi$ pulses during a constant evolution time period (e.g., one rotor period). MAT-2 techniques include the five $\pi$ replicated magic angle turning (FIREMAT) (Hu et al., *An Isotropic Chemical Shift-Chemical Shift Anisotropy Magic Angle Slow-Spinning 2D NMR Experiment*, J. Magn. Reson. 1993; A 105: 82–87; and Alderman et al., *A Sensitive, High Resolution Magic Angle Turning Experiment for Measuring Chemical Shift Tensor Principal Values*, Molecular Physics 1998; 95(6): 1113–1126) and the 2D-phase-altered spinning sidebands (PASS) techniques (Antzutkin et al., *Two-Dimensional Sideband Separation in Magic-Angle-Spinning NMR*, J. Magn. Reson 1995; A115: 7–19). All of these experiments are 2D isotropic-anisotropic chemical shift correlation experiments yielding a high resolution isotropic chemical shift dimension and a chemical shift anisotropy dimension. Although MAT has been applied in solid state NMR (see Hu et al., *Magic Angle Turning and Hopping*; Gan et al., *High-Resolution Chemical Shift and Chemical Shift Anisotropy Correlation in Solids Using Slow Magic Angle Spinning*, J. Am. Chem. Soc. 1992; 114: 8307–8309; Hu et al., *Magic-Angle-Turning Experiments for Measuring Chemical-Shift-Tensor Principal Values in Powdered Solids*, J. Magn. Reson. 1995: A 113: 210–222; Hu et al., *An Isotropic Chemical Shift-Chemical Shift Anisotropy Magic Angle Slow-Spinning 2D NMR Experiment;* Alderman et al., *A Sensitive, High Resolution Magic Angle Turning Experiment for Measuring Chemical Shift Tensor Principal Values;* and Antzutkin et al., *Two-Dimensional Sideband Separation in Magic-Angle-Spinning NMR*), its potential for biological research has not been explored.

One of the reasons that MAT for biological objects, as opposed to solid objects, has not been investigated is the belief that the diffusion of the molecules containing the nuclei of interest in the internal static local magnetic fields results in a time-dependent field as experienced by the nuclei. This effect worsens if the spinning frequency is reduced, resulting in imperfect suppression of the SSB's. Indeed, it was shown that a sideband-suppression technique called total suppression of sidebands (TOSS) was ineffective for suppressing SSB's arising from water embedded in glass beads when the spinning speed was lowered (see Liu et al, *Manipulation of Phase and Amplitude Modulation of Spin magnetization in Magic Angle Spinning NMR in the Presence of Molecular Diffusion*, J. Chem. Phys. 2001; 114: 5729–5734).

Another approach for increasing the sensitivity and resolution of NMR spectroscopy involves rotating the magnetic field around the sample rather than the sample around the magnetic field. According to this approach the sample remains stationary. For example, Bradbury et al., *Nuclear Magnetic Resonance in a Rotating Magnetic Field*, Phys. Letters 1968; 26A: 405–406, disclose rotating the static magnetic field by superposing a static field and two sinusoidal fields in phase quadrature in the plane perpendicular to the static field and with amplitudes that are a factor √2 larger than that of the static component. However, this approach was never considered any further.

Thus, a need exists for a method for obtaining high resolution magnetic resonance analysis of biological objects. In particular, there is a need for a magnetic resonance analysis technique that does not damage tissue or cell structure in biological objects and avoids the problems associated with SSBs at slow object spinning rates.

SUMMARY OF THE INVENTION

The present invention provides a method for magnetic resonance analysis of an object by combining slow magic angle techniques with certain radio frequency pulse sequences. This combination provides for the first time a method for obtaining high resolution spectra of a biological object that (a) does not damage tissue or cellular structure in the biological object and (b) substantially eliminates spinning sideband peaks in the spectra associated with slow magic angle spinning. Contrary to the conventional expectation that the diffusion of the molecules containing the nuclei of interest in the internal static local magnetic fields would be problematic for slow spinning, the inventors have surprisingly discovered that the inventive method provides SSB suppression at low rotation frequencies.

In particular, according to a first embodiment of the invention there is provided a method of performing a magnetic resonance analysis of a biological object that includes placing the biological object in a main magnetic field and in a radio frequency field, the main magnetic field having a static field direction; rotating the biological object at a rotational frequency of less than about 100 Hz around an axis positioned at an angle of about 54°44' relative to the main magnetic static field direction; pulsing the radio frequency to provide a sequence that includes a magic angle turning pulse segment; and collecting data generated by the pulsed radio frequency.

According to a second embodiment of the invention there is provided a method of performing a magnetic resonance analysis of a biological object that includes placing the biological object in a main magnetic field and in a radio frequency field, the main magnetic field having a static field direction; rotating the biological object at a rotational frequency of less than about 100 Hz around an axis positioned at an angle of about 54°44' relative to the main magnetic static field direction; pulsing the radio frequency to provide a sequence capable of producing a spectrum that is substantially free of spinning sideband peaks; and collecting data generated by the pulsed radio frequency.

According to a third embodiment of the invention there is provided a method of performing a magnetic resonance analysis of a biological object that includes subjecting the biological object to a static magnetic field and a pulsed radio frequency field, the main magnetic field having a static field direction; rotating the biological object at a rotational frequency of less than about 100 Hz around an axis positioned at an angle of about 54°44' relative to the main magnetic static field direction; controlling the pulsed radio frequency to provide a sequence of pulses of radio frequency radiation capable of producing a spectrum that is substantially free of spinning sideband peaks; and generating a magnetic resonance analysis of the response by nuclei in the biological object to the pulsed radio frequency sequence.

According to a fourth embodiment of the invention there is provided a method of performing a magnetic resonance analysis of a biological object that includes placing the biological object in a main magnetic field and in a radio frequency field, the main magnetic field having a static field direction; positioning the object along a magic axis located at an angle of about 54°44' relative to the main magnetic static field direction; reorienting the main magnetic field about the magic angle axis between three predetermined positions at a rotational frequency of less than about 100 Hz, the three predetermined positions being related to each other by 120°; pulsing the radio frequency to provide a sequence capable of producing a spectrum that is substantially free of spinning sideband peaks; and collecting data generated by the pulsed radio frequency.

According to a fifth embodiment of the invention there is provided a method of performing a magnetic resonance analysis of a biological object that includes providing a main magnetic field that includes a first component having a static field direction and an amplitude and a second and a third component, each second and third component having a sinusoidal field in a plane perpendicular to the static field direction of the first component and with an amplitude that is $2^{1/2}$ times the amplitude of the static field of the first component, wherein the second and third components produce a magnetic field that rotates at a frequency of less than about 100 Hz around an axis located at an angle of about 54°44' relative to the static field direction of the first component; placing the biological object in the main magnetic field and in a radio frequency field; pulsing the radio frequency to provide a pulse sequence capable of producing a spectrum that is substantially free of spinning sideband peaks; and collecting data generated by the pulsed radio frequency.

The methods of the invention are especially useful for increasing the NMR sensitivity in a MRI experiment, and for increasing the sensitivity and resolution of NMR spectra of $^1$H and other NMR-sensitive nuclei in MRS experiments in intact excised tissues and organs and in live animals and humans. The slower rotating of the sample according to the present invention minimizes, if not substantially eliminates tissue and cellular damage. The invention has several important advantages over fast MAS: (I) larger rotors and, henceforth, larger samples can be used, which increases the NMR sensitivity (especially important when the method is applied for less NMR-sensitive nuclei than protons); (II) the structural integrity of the biological sample undergoes minimal or no changes under slow spinning (i.e., artifacts in the spectra induced by the fast spinning, which are a result of the sample deformation during the spinning, are avoided); and (III) besides the isotropic spectrum, the anisotropy patterns of the individual water and metabolite lines can be determined (allowing one to obtain information regarding the immediate surroundings of the various compounds).

BRIEF DESCRIPTION OF THE DRAWINGS

Preferred embodiments of the invention will be described in more detail with reference to the following drawings:

FIGS. 5A, 5B and 5C show $^1$H 2D-PASS spectra obtained by analyzing an excised intact mouse brain using a preferred embodiment of the invention;

FIGS. 5D and 5E show $^1$H spectra obtained by analyzing an excised intact mouse brain using prior art fast MAS;

FIGS. 7A–7H show proton spectra of different excised intact mouse organs and tissues.

DETAILED DESCRIPTION OF PREFERRED EMBODIMENTS

For ease of understanding, the following terms used herein are described below in more detail:

"Object" means a three-dimensional object such as an intact animal, an animal organ, a solid object such as an archaeological artifact, a spectrographic sample such as a tissue or cellular slice, a liquid non-biological material such as an organic compound or a solid material such as a metallic powder.

"Fluid object" means an object that includes a substantial amount of fluid (such as greater than about 60 weight %.), as opposed to a solid object. A typical example of a fluid object is an intact human or a human organ that typically includes at least about 80 weight % water.

"Biological object" means any object, usually a fluid object, that includes cellular matter. Exemplary biological objects include cell systems, excised tissues and intact organs, live animals, and human patients.

"Main magnet" or "main magnetic field" denotes the magnet that generates the static magnetic field (typically referred to as $B_0$ or $H_0$) as known in the art. The main magnetic field is distinguished from the RF magnetic field used to induce excitation of the atomic nuclei or the RF magnetic gradient field used in magnetic resonance. Of course, MRS and MRI tools that could be used with the method of the invention include a main magnet capable of producing the static and homogeneous main magnetic field. Such magnets are well known and typically are superconducting magnets.

Slow magic angle spinning is based on exposing the object to a partially time-dependent external magnetic field rather than the static magnetic field $B_0$ currently used. Specifically, the magnetic field consists of a static component with amplitude $B_0/\sqrt{3}$, and a component of amplitude $B_0\sqrt{2/3}$, rotating in a plane perpendicular to the static field component.

In accordance with the first, second and third embodiments of the invention the slow magic angle spinning involves spinning or rotating the object at a frequency of less than about 100 Hz, preferably less than about 10 Hz, and more preferably less than about 3 Hz. An example of a range of possible rotating frequencies is about 1 to about 100 Hz, preferably about 1 to about 5 Hz. In contrast, fast magic angle spinning employs frequencies on the order of at least one kHz. In accordance with the fourth and fifth embodiments of the invention the magnetic field is rotated around a stationary biological object at a frequency of less than about 100 Hz, preferably less than about 10 Hz, and more preferably less than about 3 Hz. An example of a range of possible rotating frequencies is about 1 to about 100 Hz, preferably about 1 to about 5 Hz.

Figure 1:
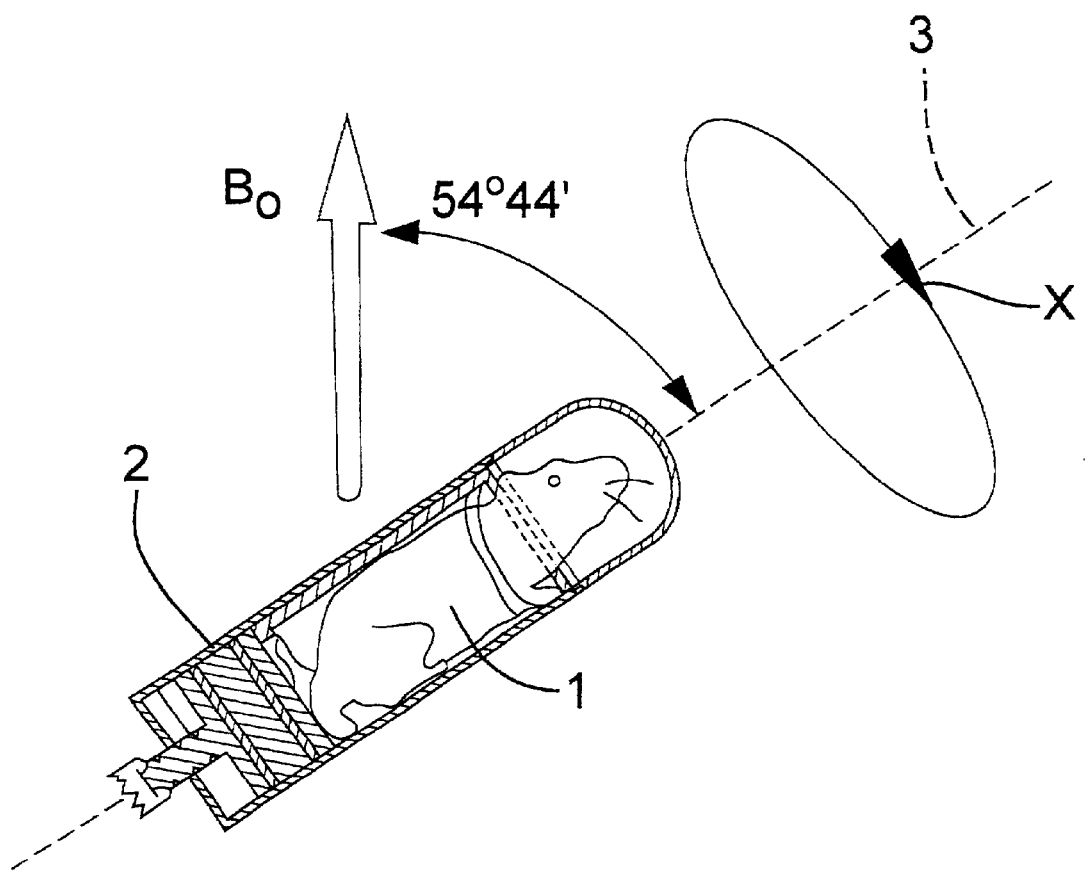
FIG. 1 is a perspective view of rotating a biological object at the magic angle relative to the main static magnetic field.

An example of a configuration for rotating the object while the main static magnetic field is stationary is shown in FIG. 1. A biological object 1 is placed in a sample holder 2 that is rotatable about an axis 3 in a direction X placed in a static magnetic field generated by a main magnet (not shown) in a MRS or MRI tool. Axis 3 is located at an angle of 54°44' relative to the direction of the static magnetic field $B_0$. MRS (e.g., NMR) and MRI apparatus capable of rotating an object or sample for MAS are well known (see e.g., U.S. Pat. No. 4,511,841). Commercially available NMR tools that have rotors for spinning a sample include those probes available from Chemagnetics, Inc. (Ft. Collins, Colo.) or Bruker Instruments, Inc. (Billerica, Mass.).

The RF pulse sequence employed in the present invention may be any sequence or series of sequences capable of producing a high resolution spectrum that is substantially free of spinning sideband. The RF pulse sequences can be repeated during every rotor period (i.e., one 360° rotation of the object) throughout the duration of the scanning. A typical characteristic of these RF pulse sequences may be isotropic-anisotropic chemical shift correlation pulse sequences. Exemplary RF pulse sequences include MAT sequences. These RF pulse sequences preferably can be applied synchronously with the spinning of the object. A combination of RF pulse sequences that each have a different function may be used.

One example of a MAT technique that could be used in the invention involves applying five RF π pulses during a constant evolution time period (e.g., one rotor period). A π pulse rotates the magnetization over 180°. An illustrative five RF π pulses technique is the five π replicated magic angle turning (FIREMAT) as described, for example, in Hu et al., *An Isotropic Chemical Shift-Chemical Shift Anisotropy Magic Angle Slow-Spinning 2D NMR Experiment*, J. Magn. Reson. 1993; A 105: 82–87; and Alderman et al., *A sensitive, high resolution magic angle turning experiment for measuring chemical shift tensor principal values*, Molecular Physics 1998; 95(6): 1113–1126. Another illustrative five RF π pulses technique is the 2D-phase-altered spinning sidebands (PASS) technique as described, for example, in Antzutkin et al., *Two-Dimensional Sideband Separation in Magic-Angle-Spinning NMR*,. J. Magn. Reson 1995; A115: 7–19). All of these experiments are 2D isotropic-anisotropic chemical shift correlation experiments yielding a high resolution isotropic chemical shift dimension and a chemical shift anisotropy dimension.

Another RF pulse sequence that is useful in the invention is a water suppression segment that suppresses residual SSBs caused by water in a biological object. The water suppression pulse sequence may be used for analysis of metabolite spectra. Without water suppression these metabolite spectra would be polluted by artificial lines arising from residual SSBs of the water. Of course, water suppression is not used when it is desired to investigate the water peak or signal of a biological object. An exemplary water suppression segment is a DANTE pulse sequence as described, for example, in Morris et al., *Selective Excitation in Fourier Transform Nuclear Magnetic Resonance*, J. Magn. Reson., 1978; 29:433–462. Another possible water suppression sequence is the known combination of a shaped pulse segment and a pulsed field gradient segment.

Figure 2:
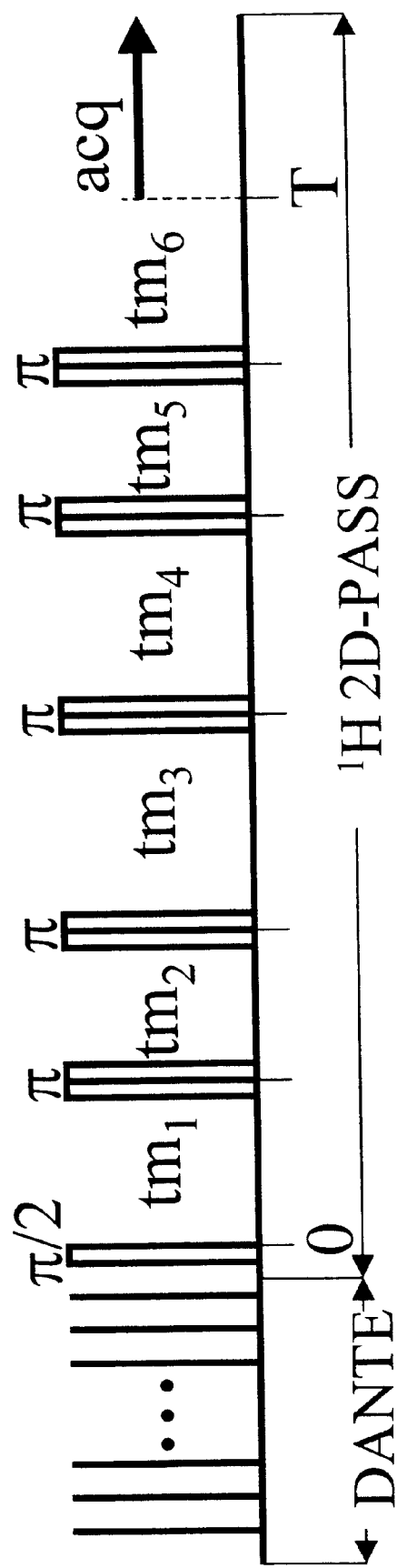
FIG. 2 represents a preferred RF pulse sequence in accordance with the invention.

According to an example of the invention, the RF pulse sequence includes a DANTE pulse sequence segment followed by a 2D-PASS sequence segment as shown in FIG. 2. In this instance, the cross-polarization component described in Antzutkin et al., *Two-Dimensional Sideband Separation in Magic-Angle-Spinning NMR*, was replaced by a π/2 pulse to create an initial magnetization in a plane perpendicular to that of $B_0$. In a 2D-PASS spectrum, the sidebands typically are separated by the order n of the SSB. The center-band spectrum, where n=0, displays a SSB-free spectrum, whereas the other spectra show the SSB spectra in increasing order. By shifting the side-band spectra by n times the spinning frequency and adding them all together, an isotropic spectrum may be obtained. As was explained in Antzutkin et al., *Two-Dimensional Sideband Separation in Magic-Angle-Spinning NMR*, an intrinsic $T_2$ weighting of one rotor period can be introduced in 2D-PASS. In order to compensate for pulse imperfections and RF field inhomogeneity, a phase cycling sequence may be applied. A preferred phase cycle consists of about 96 steps, and is substantially the same as originally developed for the FIREMAT experiment (see Alderman et al., *A Sensitive, High Resolution Magic Angle Turning Experiment for Measuring Chemical Shift Tensor Principal Values*). It has been found that fewer phase steps could be used in the invention without major spectral distortions. The timings $tm_1$–$tm_6$ between the six pulses may be determined by the so-called PASS-16 sequence given in Antzutkin et al., *Two-Dimensional Sideband Separation in Magic-Angle-Spinning NMR*. Sixteen different combinations of delay times $tm_1$–$tm_6$ were used (to be called evolution increments hereafter), which makes it possible to separate the centerband and 15 sideband spectra without spectral aliasing. The width of the $\pi$ pulse varies typically on the order of tens of microseconds to a millisecond, depending on the type and the amount of tissue loaded into the rotor. In FIG. 2 time point "T" denotes the rotor period, time point "0" denotes the start of the rotor evolution and "acq" denotes acquisition of the NMR signal. The timings were counted from the middle of the $\pi$ pulses. Two extra data points were acquired at the beginning of the acquisition dimension to account for the dead time effect associated with probe ring down and receiver recovery, which were not included in the Fourier transformation. Fourier transformation using only 16 points along the evolution dimension was applied.

The fourth embodiment of the invention utilizes a technique generally known in the art as magic angle hopping (MAH). In particular, the main magnetic field is quickly reoriented (i.e., "hopped") about the magic angle axis between three predetermined positions at a rotational frequency of less than about 100 Hz, the three predetermined positions being related to each other by 120°. One methodology for accomplishing this reorientation is to hop or rotate the biological object three times (e.g., 0–120 degrees, 120–240 degrees and 240–0 degrees, or 0–120 degrees, 120-240 degrees and 240–360 degrees) about an axis at the magic angle. The RF frequency may be pulsed to produce a high resolution spectrum that is substantially free of line broadening caused by the bulk magnetic susceptibility and the residual chemical shift interaction. Illustrative MAH techniques and the accompanying RF pulse sequences are described, for example, in Bax et al., *Correlation of Isotropic Shifts and Chemical Shift Anisotropies by Two-Dimensional Fourier-Transform Magic-Angle Hopping NMR Spectroscopy*, J. Magn. Reson. 1983; 52: 147; Gan Z. *High-Resolution Chemical Shift and Chemical Shift Anisotropy Correlation in Solids Using Slow Magic Angle Spinning*, J. Am. Chem. Soc. 1992; 114: 8307–8309; Hu et al., *Magic-Angle-Turning Experiments for Measuring Chemical-Shift-Tensor Principal Values in Powdered Solids*, J. Magn. Reson. 1995: A 113: 210–222; Hu et al., *Improving the Magic Angle Hopping Experiment*, Solid State NMR, 2, 235–243 (1993); and Hu et al., *Magic Angle Turning and Hopping*, in Encyclopedia of Magnetic Resonance D. M. Grant, and R. K. Harris, Eds. New York: John Wiley & Sons: 1996, 2914–2921. A water suppression RF pulse sequence as described above could also be used in connection with MAH techniques.

The fifth embodiment of the invention utilizes a magnetic field that is a superposition of a static field and two sinusoidal fields in phase quadrature in the plane perpendicular to the static field and with amplitudes that are a factor $2^{1/2}$ larger than that of the static component. In particular, three RF coil configurations are used to produce magnetic fields in three mutually perpendicular directions. Applying a stationary current to one of the coils and quadrature sinusoidal currents to the other two coils generates a rotating magnetic field having frequencies of about 1 to about 100 Hz, preferably about 1 to about 10 Hz. In other words, a magnetic field is created that rotates relative to a stationary object. Furthermore, by making the amplitude of the sinusoidal fields $2^{1/2}$ times larger than the stationary or static field, the resulting magnetic field rotates at the required magic angle.

The RF radiation utilized in the pulse sequence of the invention can be generated by RF coils in a MR apparatus as known in the art. The RF pulse sequencing may be generated by techniques known in the art. For example, most modern NMR and MRI spectrometers have pulse programmers and amplifiers that are capable of producing the sequences.

The data for generating a spectrographic analysis based on the inventive method can be collected by the same coil used for generating the RF radiation, or by a separate receiver coil. A graphical representation of the collected data may be generated by techniques known in the art such as, for example, software programs available on most modern NMR and MRI spectrometers.

The specific example described below is for illustrative purposes and should not be considered as limiting the scope of this invention.

Sample Preparation

Fresh tissues were excised from four mice, which were genetic mutants of 129/SvJ mice cross-bred with C57BI/6J. The mice used carry hereditary hemochromatosis, a single genetic mutation that results in excess iron deposition in tissues if excess iron is provided in the mouse ration. Tissues analyzed were considered normal, as the ration provided these mice had normal levels of iron. Forty-five days old male and female mice weighing 20 grams were sacrificed by cervical dislocation, tissues were rapidly removed and either immediately analyzed (brain and liver) or stored from two to four hours at 2° C. before analysis (kidney, heart and gluteus muscle). The tissues were inserted into a 7.5-mm outer diameter, 5-mm inner diameter pencil rotor commercially available from Chemagnetics Inc., and were held between two TEFLON plugs in the center of the rotor. All experiments were performed at about 25° C.

Results $^1$H NMR experiments were performed on a Chemagnetics 300 MHz Infinity spectrometer, with a proton Larmor frequency of 299.982 MHz. A standard cross-polarization (CP)/MAS probe with a 7.5-mm pencil type spinner system and an air-flow restriction in the driver channel was used. In this way it was possible to regulate the spinning rate with an accuracy of about ±2Hz over a spinning range from 43 to 125 Hz. Following conventional practice, the $^1$H spectra are expressed in "ppm" which means part per million of the spectrometer operating frequency.

Figure 3A:
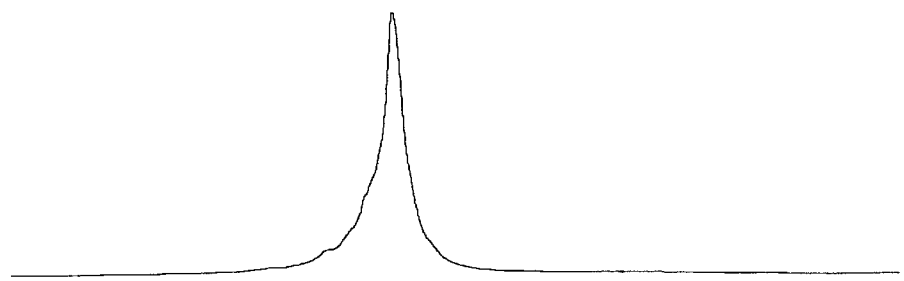
FIGS. 3A and 3B show $^1$H spectra obtained by analyzing an excised intact mouse brain using conventional NMR techniques and a stationary sample.
Figure 3B:
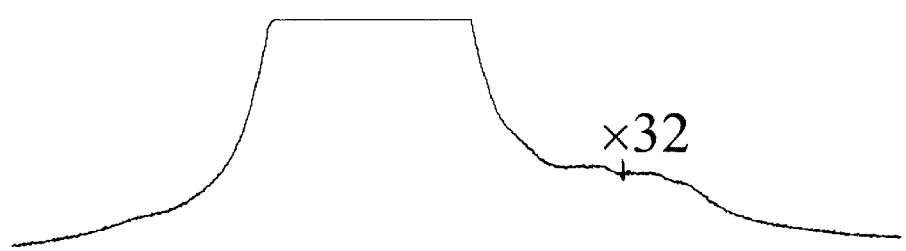
Figure 3B:
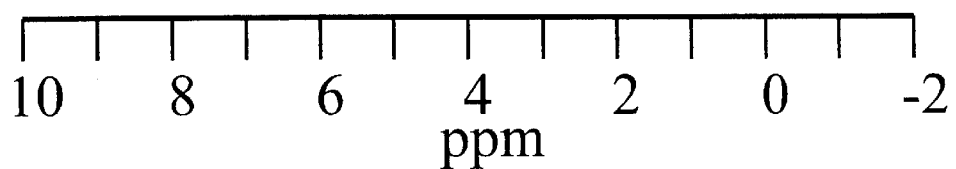

FIGS. 3A and 3B show the Block decay 1D spectrum, obtained without water suppression on a static sample of a freshly excised mouse brain in accordance with conventional NMR techniques. The experiments were performed within 15 minutes after the tissue was excised. The spectra were acquired following the excitation of a RF pulse with a tip angle of about 10 degrees. The delay between the end of the pulse and the start of data acquisition was 20 $\mu$s. FIG. 3A shows the static spectrum and FIG. 4B shows the same spectrum with a magnification factor of 32. A water line and some barely visible metabolite peaks can be discriminated. The spectral resolution is poor.

Figure 3C:
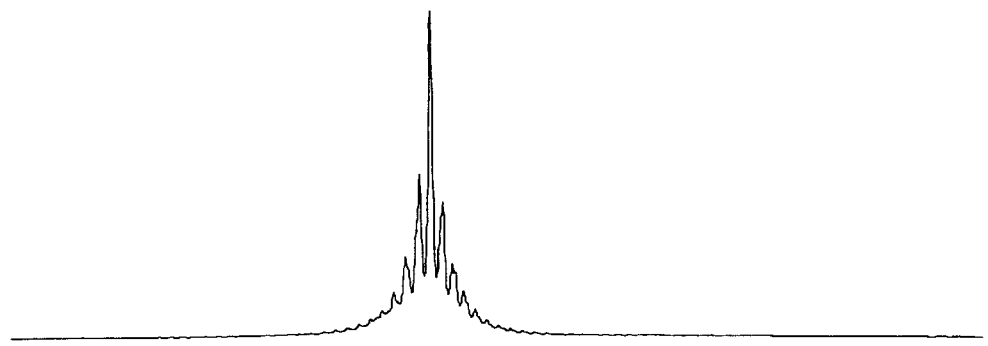
FIGS. 3C and 3D show $^1$H spectra obtained by analyzing an excised intact mouse using slow MAS but with RF pulse sequencing that did not include a water suppression segment and a MAT segment.
Figure 3D:
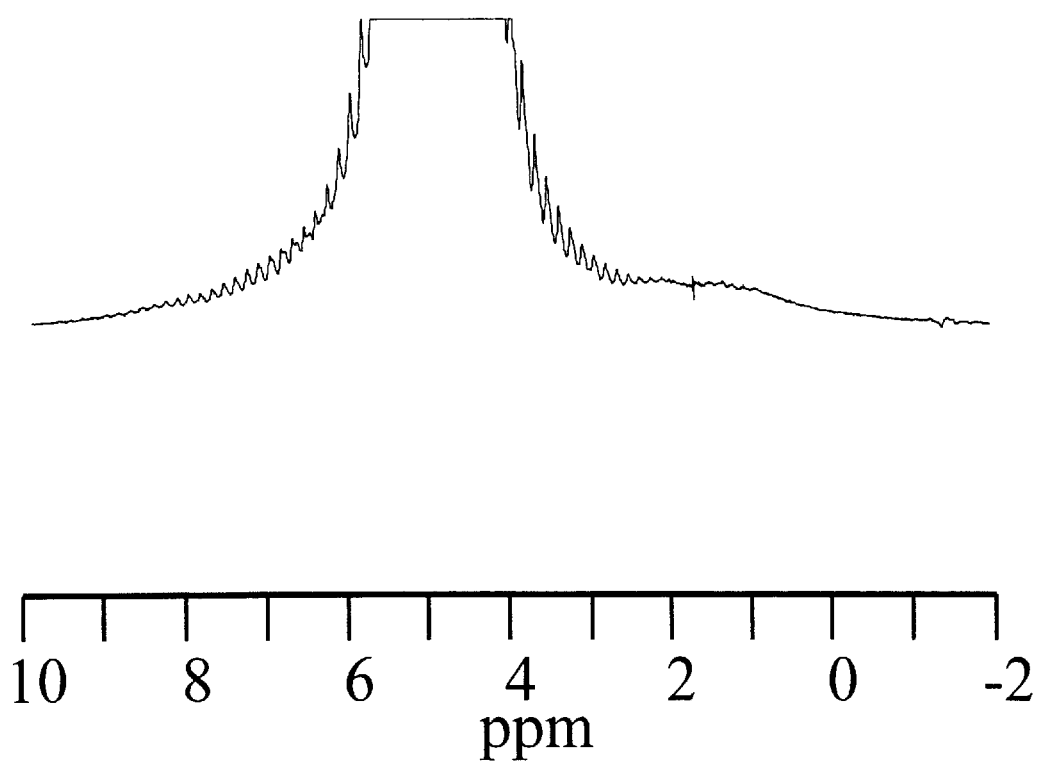

FIG. 3C shows the 1D spectrum of an excised mouse brain tissue undergoing MAS at a frequency of 43 Hz but with a RF pulse sequence that did not include a water suppression segment and a MAT segment. FIG. 3D shows the corresponding 32-fold magnification. The line width (FWHM) of the center band is approximately 13 Hz, which is significantly less than that (105 Hz) of the stationary spectrum. However, the sideband families from the metabolites are superimposed with each other and are also superimposed with SSBs from the water resonance (FIG. 3D), making the assignment of the spectrum impossible.

Figure 4:
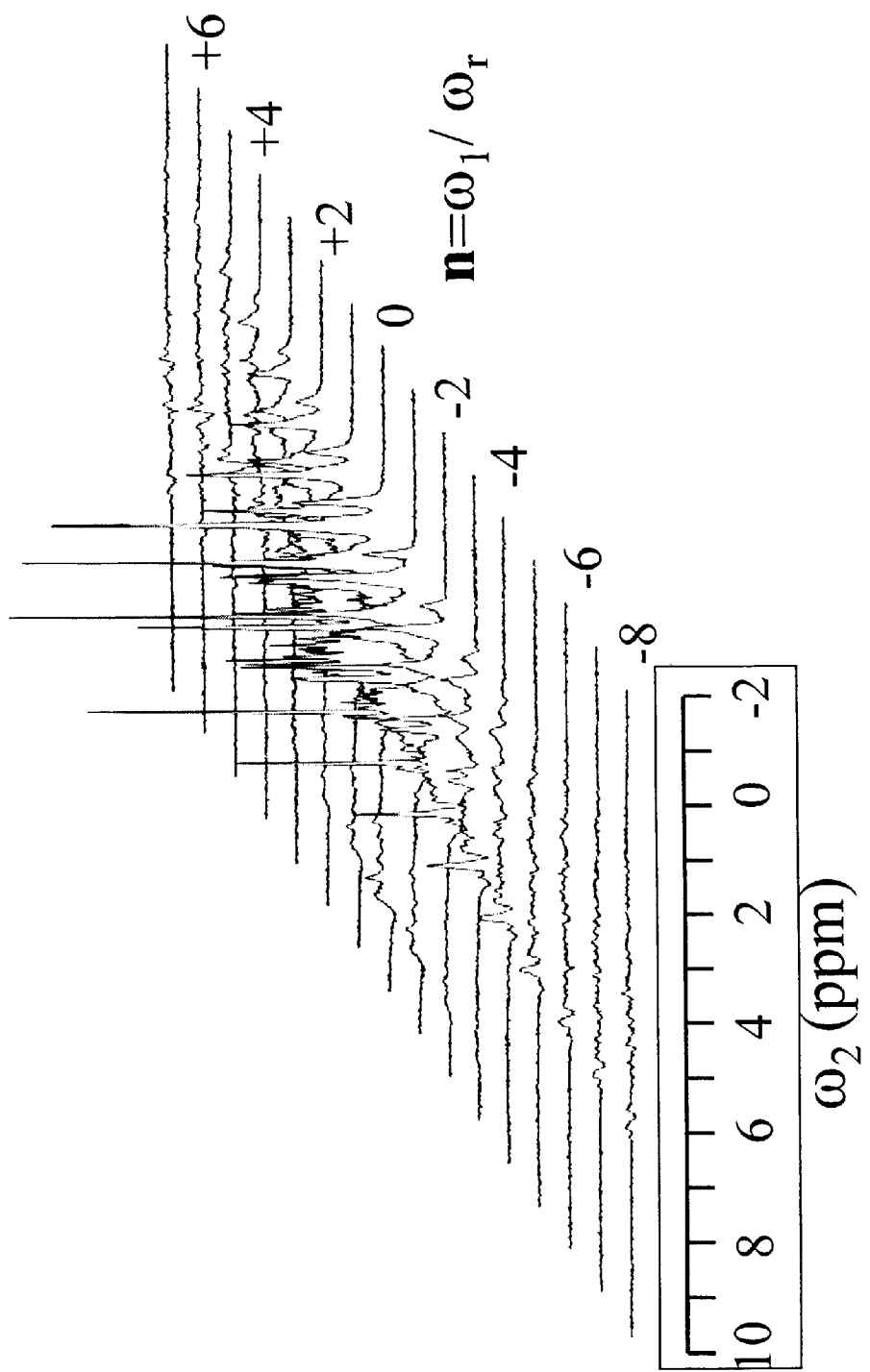
FIG. 4 shows a stacked plot of a $^1$H 2D-PASS spectra obtained by analyzing an excised intact mouse brain using a preferred embodiment of the invention.

FIG. 4 shows the stacked plot of the $^1$H 2D-PASS spectrum of the same brain tissue as in FIG. 3 acquired at a sample spinning rate of 43 Hz. In this case water suppression was used. This was achieved by applying the DANTE pulse sequence at the center band of the water spectrum. In this way, both the signal arising from the center band and the SSBs are saturated. The parameter n denotes the nth sideband, n=0 corresponds to the center band. The spectrum was acquired 24 minutes after the brain was excised. Sixteen evolution increments were used, each with 96 phase increments, resulting in a total of 1,536 acquisitions. The recycle delay time was 2 s, resulting in an experimental time of about 52 minutes. The $^1$H π/2 pulse width was 9 microseconds. The DANTE sequence contained 4000 pulses spaced by 100 μmicroseconds, each of which was 1 microsecond. In FIG. 4 $\omega_2$ denotes the acquisition dimension, $\omega_1$ denotes the evolution dimension and $\omega_r$ denotes the angular spinning frequency.

FIG. 5A shows the (water-suppressed) proton spectrum, obtained by projecting the 2D-PASS data into the normal acquisition ($\omega_2$) dimension (without an initial π/2 pulse). This spectrum reflects the result of a standard 1D experiment applied at 43 Hz. Due to the overlapping of the SSB families from different metabolites, even with water suppression such a 1D spectrum is difficult to interpret. FIGS. 5B and 5C display the n=0 center-band spectrum and the isotropic projection, respectively. Despite the relatively short $T_2$ weighting time of one rotor period used in the 2D-PASS experiment (≈23.3 msec in this case), an impressive spectral resolution is observed, indicating that the line broadening observed in the brain can be removed efficiently using the 2D-PASS experiment. The relative intensities of the various lines in the isotropic projection spectrum (FIG. 5C) are slightly different from those in the center-band spectrum (FIG. 5B), which is a result of differences in the anisotropy patterns of the various lines. Also, the spectral resolution in the isotropic spectrum is somewhat less than that of the center band. This is due to the slight instability of the spinning rate, which has almost no effect on the center-band spectrum but broadens the lines in the side-band spectra, increasing with the order of the sideband. FIG. 5D shows the brain spectrum, obtained from a standard 1D fast MAS experiment at a spinning rate of 4.3 kHz. It follows that despite the much larger spinning rate the spectral resolution is actually less than that of the center-band spectrum obtained from 2D-PASS. This is, in part, due to the intrinsic 23.3-msec $T_2$ weighting employed in the latter experiment. This is shown in FIG. 5E, where the same spectrum is shown after using a 23 msec $T_2$ weighting, obtained by applying a π pulse train. Even in this case the width of the lines are about 8 Hz broader than those in the center-band spectrum of 2D-PASS, causing an apparent relative intensity drop for the two narrowest resonance lines at 2.0 and 3.0 ppm, which are from N-acetylaspartate and creatine, respectively. This extra broadening is probably caused by an increased $B_0$ inhomogeneity along the spinning axis induced by the 4.3 kHz spinning, which is not averaged out by the spinning. The fast spinning pushes the sample against the rotor wall and creates a hole in the middle, resulting in increased bulk susceptibility gradients at the boundary of the sample and the hole.

Figures 6A, 6B, 6C:
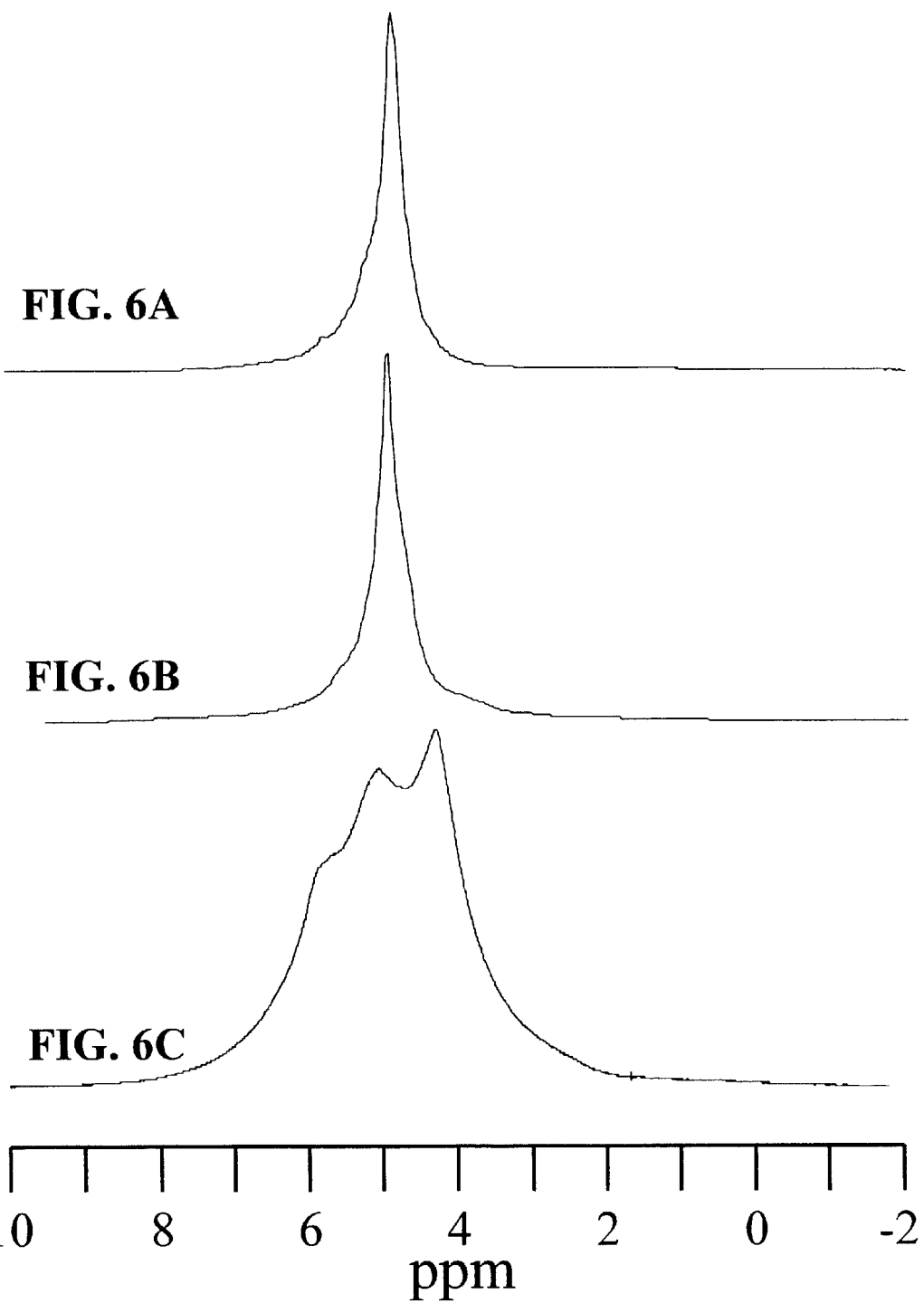
FIGS. 6A, 6B and 6C show proton spectra of a stationary sample obtained by analyzing an excised intact mouse brain with a RF pulse sequence that did not include a water suppression segment.

FIGS. 6A, 6B and 6C illustrate the effects of such rapid sample spinning. In this figure the static water line is shown before spinning (FIG. 6A), after spinning at 43 Hz (FIG. 6B), and after spinning at 4.3 kHz (FIG. 6C). It follows that the slow spinning hardly affects the line shape, but that the sample deformation due to the fast spinning causes severe line broadening. We found that repacking the rotor after the fast spinning produced a similar spectrum as shown in FIG. 6A, proving that the sample deformation is the cause of this broadening. Hence, in order to avoid this effect in a fast spinning experiment it is necessary to use densely-packed samples in a spherical sample holder. By using slow sample spinning as in the presently described methods, this problem is avoided.

FIGS. 7A and 7B show the spectra on a mouse heart using 2D-PASS and water suppression at 80 Hz according to the invention (7A) and using 1D-MAS and water suppression at 4.4 kHz (7B). FIGS. 7C and 7D show the spectra on a mouse liver using 2D-PASS and water suppression at 100 Hz according to the invention (7C) and using 1D-MAS and water suppression at 3.3 kHz (7D). FIGS. 7E and 7F show the spectra on a mouse gluteus muscle using 2D-PASS and water suppression at 125 Hz according to the invention (7E) and using 1D-MAS and water suppression at 4.2 kHz (7F). FIGS. 7G and 7H show the spectra on a mouse kidney using 2D-PASS and water suppression at 100 Hz according to the invention (7G) and using 1D-MAS and water suppression at 5.7 kHz (7H). It is clear from FIGS. 7A–7F that for the heart, liver, and gluteus muscle both slow MAS and fast MAS methods provide spectra with very similar resolutions and intensities. In the kidney (FIGS. 7G and 7H) the lines obtained with fast spinning are somewhat broader than those obtained with slow MAS, which may be caused again by extra susceptibility gradients imposed by the spinning.

These results demonstrate that the slow spinning method of the invention produces spectral resolutions that are similar, and in some cases even better, compared to spectral resolutions obtained with fast MAS.

Having illustrated and described the principles of our invention with reference to several preferred embodiments, it should be apparent to those of ordinary skill in the art that the invention may be modified in arrangement and detail without departing from such principles.

What is claimed is:

1. A method of performing a magnetic resonance analysis of a biological object comprising:

placing the biological object in a main magnetic field and in a radio frequency field, the main magnetic field having a static field direction;

rotating the biological object at a rotational frequency of less than about 100 Hz around an axis positioned at an angle of about 54°44' relative to the main magnetic static field direction;

pulsing the radio frequency to provide a pulse sequence that includes a magic angle turning pulse segment and a water suppression pulse segment; and collecting data generated by the pulsed radio frequency.

2. A method according to claim 1 wherein the water suppression pulse segment comprises a DANTE sequence.

3. A method according to claim 1 wherein the magic angle turning pulse segment comprises a 2D-PASS sequence.

4. A method according to claim 3 wherein the 2D-PASS sequence includes an initial π/2 pulse.

5. A method according to claim 1 wherein the pulse sequence comprises at least one isotropic-anisotropic chemical shift correlation pulse sequence.

6. A method according to claim 1 wherein the biological object is rotated at a rotational frequency of about 1 to about 100 Hz.

7. A method according to claim 1 wherein the main magnetic field remains stationary during the biological object rotation.

8. A method according to claim 1 wherein the biological object comprises a fluid object.

9. A method of performing a magnetic resonance analysis of a biological object comprising:

placing the biological object in a main magnetic field and in a radio frequency field, the main magnetic field having a static field direction;

rotating the biological object at a rotational frequency of less than about 100 Hz around an axis positioned at an angle of about 54°44' relative to the main magnetic static field direction;

pulsing the radio frequency to provide a pulse sequence that includes a water suppression pulse segment and applying five radio frequency π pulses during a constant biological object evolution time period; and collecting data generated by the pulsed radio frequency.

10. A method according to claim 9 wherein the pulse sequence is selected from a FIREMAT sequence and a 2D-PASS sequence.

11. A method according to claim 9 wherein the biological object comprises a fluid object.

12. A method of performing a magnetic resonance analysis of a biological object comprising:

placing the biological object in a main magnetic field and in a radio frequency field, the main magnetic field having a static field direction;

rotating the biological object at a rotational frequency of less than about 100 Hz around an axis positioned at an angle of about 54°44' relative to the main magnetic static field direction;

pulsing the radio frequency to provide a pulse sequence that includes a water suppression pulse segment followed by a magic angle turning pulse segment; and collecting data generated by the pulsed radio frequency.

13. A method according to claim 12 wherein the water suppression pulse segment comprises a DANTE sequence and the magic angle turning pulse segment comprises a 2D-PASS sequence.

14. A method according to claim 12 wherein the biological object is rotated at a rotational frequency of about 1 to about 100 Hz.

15. A method according to claim 12 wherein the main magnetic field remains stationary during the biological object rotation.

16. A method according to claim 12 wherein the biological object comprises a fluid object.

17. A method according to claim 13 wherein the 2D-PASS sequence includes an initial π/2 pulse.

18. A method of performing a magnetic resonance analysis of a biological object comprising:

placing the biological object in a main magnetic field and in a radio frequency field, the main magnetic field having a static field direction;

rotating the biological object at a rotational frequency of less than about 100 Hz around an axis positioned at an angle of about 54°44' relative to the main magnetic static field direction;

pulsing the radio frequency to provide a water suppression pulse segment and a pulse sequence capable of producing a spectrum that is substantially free of spinning sideband peaks; and collecting data generated by the pulsed radio frequency.

19. A method according to claim 18 wherein the radio frequency pulse sequence comprises a magic angle turning sequence.

20. A method according to claim 18 wherein the radio frequency pulse sequence comprises at least one isotropic-anisotropic chemical shift correlation pulse sequence.

21. A method according to claim 18 wherein the biological object is rotated at a rotational frequency of about 1 to about 100 Hz.

22. A method according to claim 18 wherein the main magnetic field remains stationary during the biological object rotation.

23. A method according to claim 18 wherein the biological object comprises a fluid object.

24. A method of performing a magnetic resonance analysis of a biological object comprising:

subjecting the biological object to a main magnetic field and a pulsed radio frequency field, the main magnetic field having a static field direction;

rotating the biological object at a rotational frequency of less than about 100 Hz around an axis positioned at an angle of about 54°44' relative to the main magnetic static field direction;

controlling the pulsed radio frequency to provide a water suppression sequence and a sequence of pulses of radio frequency radiation capable of producing a spectrum that is substantially free of spinning sideband peaks; and generating a magnetic resonance analysis of the response by nuclei in the biological object to the pulsed radio frequency sequence.

25. A method according to claim 24 wherein the radio frequency pulse sequence comprises a magic angle turning sequence.

26. A method according to claim 24 wherein the pulse sequence comprises at least one isotropic-anisotropic chemical shift correlation pulse sequence.

27. A method according to claim 24 wherein the biological object comprises a fluid object.

28. A method according to claim 25 wherein the magic angle turning sequence comprises a 2D-PASS sequence.

29. A method of performing a magnetic resonance analysis of a biological object comprising:

placing the biological object in a main magnetic field and in a radio frequency field, the main magnetic field having a static field direction;

positioning the biological object along a magic angle axis located at an angle of about 54°44' relative to the main magnetic static field direction;

reorienting the main magnetic field about the magic angle axis between three predetermined positions at a rotational frequency of less than about 100 Hz, the three predetermined positions being related to each other by 120°;

pulsing the radio frequency to provide a water suppression sequence and a pulse sequence capable of producing a spectrum that is substantially free of line broadening; and collecting data generated by the pulsed radio frequency.

30. A method according to claim 29 wherein the reorienting comprises rotating the biological object about the magic angle axis wherein the biological object rotation is from about 0° to about 120°, from about 120° to about 240°, and from about 240° to 0°, relative to the magic angle axis.

31. A method according to claim 29 wherein the reorienting comprises rotating the biological object about the magic angle axis wherein the biological object rotation is from about 0° to about 120°, from about 120° to about 240°, and from about 240° to 360°, relative to the magic angle axis.

32. A method according to claim 29 wherein the biological object comprises a fluid object.

33. A method of performing a magnetic resonance analysis of a biological fluid object comprising:
   placing the biological fluid object in a main magnetic field and in a radio frequency field, the main magnetic field having a static field direction;
   rotating the biological fluid object at a rotational frequency of less than about 100 Hz around an axis positioned at an angle of about 54°44' relative to the main magnetic static field direction;
   pulsing the radio frequency to provide a pulse sequence that includes a magic angle turning pulse segment; and
   collecting data generated by the pulsed radio frequency.

34. A method of performing a magnetic resonance analysis of a biological fluid object comprising:
   placing the biological fluid object in a main magnetic field and in a radio frequency field, the main magnetic field having a static field direction;
   rotating the biological fluid object at a rotational frequency of less than about 100 Hz around an axis positioned at an angle of about 54°44' relative to the main magnetic static field direction;
   pulsing the radio frequency to provide a pulse sequence that includes applying five radio frequency π pulses during a constant biological fluid object evolution time period; and
   collecting data generated by the pulsed radio frequency.

35. A method of performing a magnetic resonance analysis of a biological fluid object comprising:
   placing the biological fluid object in a main magnetic field and in a radio frequency field, the main magnetic field having a static field direction;
   rotating the biological fluid object at a rotational frequency of less than about 100 Hz around an axis positioned at an angle of about 54°44' relative to the main magnetic static field direction;
   pulsing the radio frequency to provide a pulse sequence capable of producing a spectrum that is substantially free of spinning sideband peaks; and
   collecting data generated by the pulsed radio frequency.

36. A method of performing a magnetic resonance analysis of a biological fluid object comprising:
   subjecting the biological fluid object to a main magnetic field and a pulsed radio frequency field, the main magnetic field having a static field direction;
   rotating the biological fluid object at a rotational frequency of less than about 100 Hz around an axis positioned at an angle of about 54°44' relative to the main magnetic static field direction;
   controlling the pulsed radio frequency to provide a sequence of pulses of radio frequency radiation capable of producing a spectrum that is substantially free of spinning sideband peaks; and
   generating a magnetic resonance analysis of the response by nuclei in the biological fluid object to the pulsed radio frequency sequence.

37. A method of performing a magnetic resonance analysis of a biological fluid object comprising:
   placing the biological fluid object in a main magnetic field and in a radio frequency field, the main magnetic field having a static field direction;
   positioning the biological fluid object along a magic angle axis located at an angle of about 54°44' relative to the main magnetic static field direction;
   reorienting the main magnetic field about the magic angle axis between three predetermined positions at a rotational frequency of less than about 100 Hz, the three predetermined positions being related to each other by 120°;
   pulsing the radio frequency to provide a pulse sequence capable of producing a spectrum that is substantially free of line broadening; and
   collecting data generated by the pulsed radio frequency.

38. A method according to claim 33 wherein the magic angle turning pulse segment comprises a 2D-PASS sequence.

* * * * *